(12) United States Patent
Schulz et al.

(10) Patent No.: US 6,641,416 B2
(45) Date of Patent: Nov. 4, 2003

(54) MOUNTING HOLDER

(75) Inventors: Klaus Schulz, Berlin (DE); Andreas Stockhaus, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/835,345

(22) Filed: Apr. 16, 2001

(65) Prior Publication Data

US 2001/0036761 A1 Nov. 1, 2001

Related U.S. Application Data

(63) Continuation of application No. PCT/DE99/03310, filed on Oct. 12, 1999.

(30) Foreign Application Priority Data

Oct. 16, 1998 (DE) .......................... 198 47 843

(51) Int. Cl.[7] .............................................. H01R 13/62
(52) U.S. Cl. ...................... 439/180; 439/153; 439/358
(58) Field of Search ................. 439/180, 159, 439/152, 358, 923, 328, 153, 155, 160; 269/93, 259, 260, 254 CS

(56) References Cited

U.S. PATENT DOCUMENTS

| | | | |
|---|---|---|---|
| 3,229,239 A | | 1/1966 | Modrey |
| 4,131,982 A | | 1/1979 | Rose et al. |
| 4,809,360 A | * | 2/1989 | Kraft ........................... 439/923 |
| 5,812,370 A | * | 9/1998 | Moore et al. ................ 439/159 |
| 6,074,228 A | * | 6/2000 | Berg et al. ................... 439/180 |
| 6,102,716 A | * | 8/2000 | Fusselman et al. ......... 439/155 |
| 6,361,339 B1 | * | 3/2002 | Zhang et al. ................ 439/160 |

FOREIGN PATENT DOCUMENTS

| | | |
|---|---|---|
| DE | 1 944 848 | 8/1966 |
| DE | 197 09 231 C1 | 6/1998 |
| DE | 198 43 708 A1 | 4/2000 |

* cited by examiner

Primary Examiner—Renee Luebke
Assistant Examiner—Felix O. Figueroa
(74) Attorney, Agent, or Firm—Laurence A. Greenberg; Werner H. Stemer; Gregory L. Mayback

(57) ABSTRACT

The holder is suitable for detachably fixing a component in an operational end position. The holder has an upper side on which the component is moved into the end position along a mounting direction. The holder comprises an ejector that has at least one spring which exerts an elastic force on the component in the final position. The spring force acts in a direction opposite the mounting direction.

6 Claims, 3 Drawing Sheets

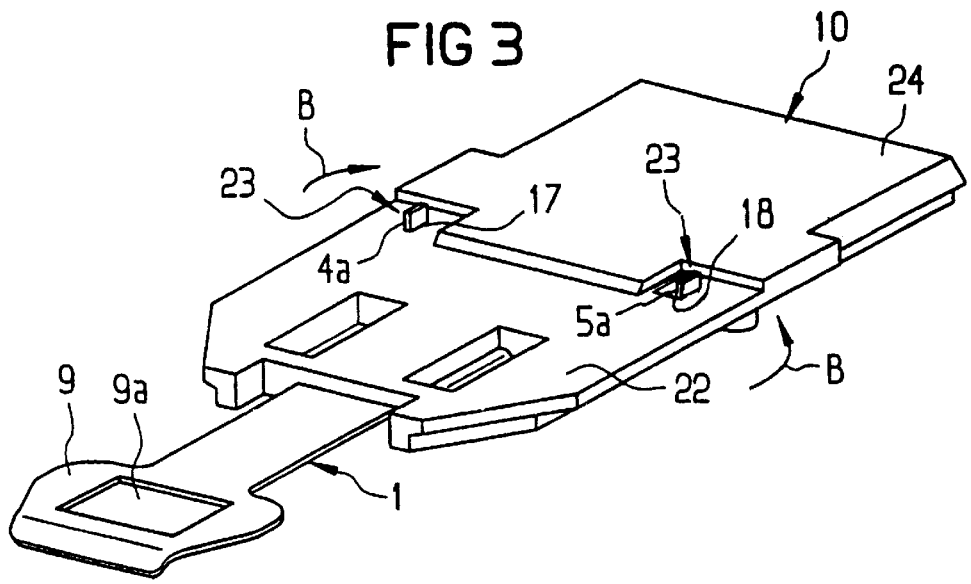
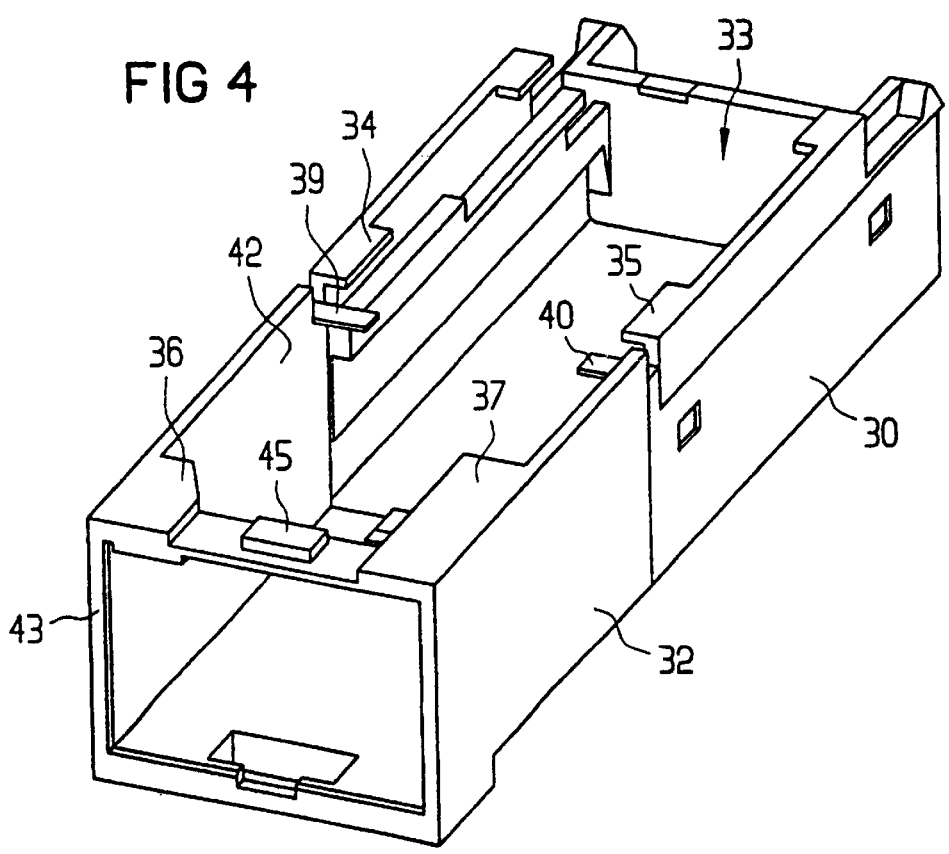

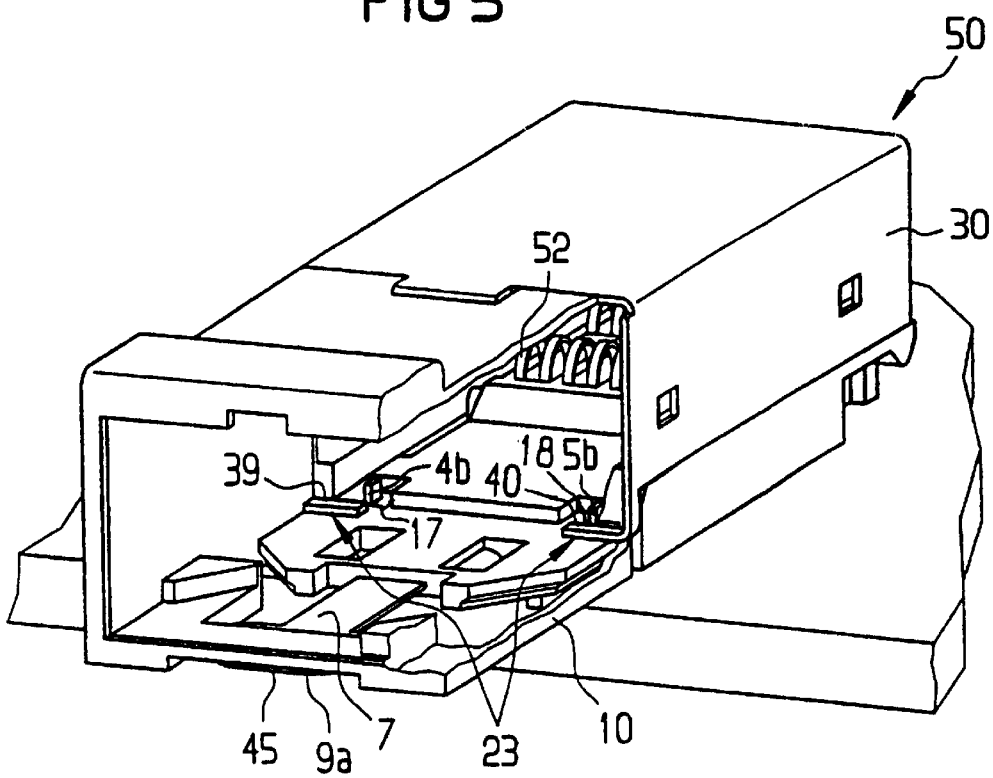

MOUNTING HOLDER

CROSS-REFERENCE TO RELATED APPLICATIONS

This application is a continuation of copending International Application No. PCT/DE99/03310, filed Oct. 12, 1999, which designated the United States.

BACKGROUND OF THE INVENTION

1. Field of the Invention

The invention relates to a mounting holder for detachably fixing a subassembly in an end position in which it is ready for operation. That kind of mounting holder is described in our older, commonly assigned patent application No. 09/815,655 (published German patent application DE 198 43 708) entitled "Device for Releasably Mounting an Electronic Component." The holder serves for the detachable mounting or fixing of an electronic subassembly such as an electro-optical transceiver on a carrier (e.g. a printed circuit board). Mounting holders such as this can be utilized for subassemblies and/or in subassemblies that must be assembled and disassembled easily in mounting locations that are relatively difficult to access.

In the mounting of subassemblies, it is particularly desirable for the user to receive clear notice upon attainment of the end position of the subassembly, in which it is ready for operation. This can be particularly important when unpracticed personnel are entrusted with the mounting, or when the mounting process is substantially dependent upon the realizable attainment of the end position, which may be the case when a correct electrical contacting of the subassembly can be guaranteed only when the end position has been attained.

2. Summary of the Invention

The object of the present invention is to provide a mounting holder for detachably fixing a subassembly in an end position in which it is ready for operation which overcomes the above-noted deficiencies and disadvantages of the prior art devices and methods of this general kind, and which assembly has improved user-friendly attributes in that it signals to the user when the end position is achieved and/or it acts to support the detachment of the subassembly.

With the above and other objects in view there is provided, in accordance with the invention, a mounting holder for detachably fixing a subassembly in an operational end position, comprising:

- a top side configured to receive thereon a subassembly to be moved along a given mounting direction into an end position; and
- an ejection mechanism comprising at least one spring disposed to exert a spring force on the subassembly in the end position thereof in a direction opposite the mounting direction.

In other words, the objects are satisfied with the novel mounting holder for detachably fixing a component or subassembly in an end position in which it is ready for operation. The device has a top side, beyond which the subassembly is moved into the end position in a direction of mounting, and having an ejection mechanism, which comprises at least one spring that exerts a spring force opposite the direction of mounting on the subassembly in the ready end position.

A first essential aspect of the invention is that the spring of the ejection mechanism is prestressed during the mounting process when the subassembly is moved along the mounting direction into the end position; thus, in dependence upon the spring constant and the spring deflection, the increasing spring power that must be overcome signals the approach of the end position. Another essential aspect of the invention is that the spring, being biased in the end position, exerts a force that acts opposite the direction of mounting, which supports the detachment and removal of the subassembly. A particular advantage consists in the ability of the spring power to eject the subassembly entirely by way of an observable excursion path. The subassembly is thus moved as needed from an end position that is inherently difficult to access into a position in which the subassembly can be handled more comfortably.

Another essential advantage of the invention consists in the ability to preassemble the ejecting mechanism as a component of the mounting holder with a high degree of precision with respect to its position relative to the mounting holder. Besides this, it can form one graspable unit with the mounting holder, which is advantageous in the production process. Its many functionalities notwithstanding, what distinguishes the inventive mounting holder overall is a remarkably simple construction.

In accordance with an added feature of the invention, the spring is formed with at least one catch disposed at the top side and projecting beyond the top side, whereby the at least one catch comes into contact with a stop at a bottom side of the subassembly when the subassembly is moved into the end position, and thereby deflects the spring.

A preferred development of the invention consists in providing the spring with at least one catch or driver in the region of the top side of the mounting holder, which protrudes over the top side and which comes in contact with a stop at the bottom side of the subassembly when the subassembly is moved into the end position, thereby deflecting the spring. This development allows a particularly compact construction of the mounting holder, wherein the catches are disposed in the region of the top side and remain over the top side, so that no additional structural space is needed in order to facilitate the assembly and detachment therewith.

A further development of the invention, which is advantageous with respect to the spring characteristics and the power generated thereby, provides that the spring have two springing legs that bend away from each other, the ends of which are formed with catches, i.e., with dogs.

In a particularly preferred development of the invention the spring is formed integrally in one-piece construction at the back end of a tongue that extends under the subassembly in the direction opposite the mounting direction and that has a locking element at its front free end. The locking element cooperates, i.e., acts in conjunction with, a locking partner of the subassembly. This way, the mounting holder serves an additional function, namely that of providing a lock between the subassembly and the mounting holder. In this regard, it is an essential feature that both the tolerances that are controlling with respect to the locking function and the tolerances that are controlling with respect to the ejection function are realized by a single integral subassembly. The relative geometric distances between the interacting functional surfaces (e.g. between the catches and the locking element) can thus be produced with an optimally reproducible precision.

A particularly space-efficient development of the invention, which is particularly advantageous in view of a low realizable structural height, is realized in that the spring is accepted in the bottom side of the mounting holder, which is averted from the subassembly.

It is possible to achieve a particularly low structural height in this regard despite an observable spring excursion by forming the spring from a flat sheet.

A development of the invention which is advantageous particularly for purposes of electrical shielding consists in the fact that the spring and a stop for the spring on the subassembly side consist of conductive material. An additional contact which is only active in the end position can thus be created via the physical contact between the spring and the stop for the spring that occurs in the end position. Besides serving shielding purposes, this can also serve monitoring purposes with respect to the attainment of the end position.

Other features which are considered as characteristic for the invention are set forth in the appended claims.

Although the invention is illustrated and described herein as embodied in a holder mechanism, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a top perspective view thereof;

FIG. 4 is a perspective view of a subassembly that connects to the mounting holder; and FIG. 5 is a partly broken-away perspective view of a subassembly that has been connected to the mounting holder, in an end position in which it is ready for operation.

DESCRIPTION OF THE PREFERRED EMBODIMENTS

Figure 1:
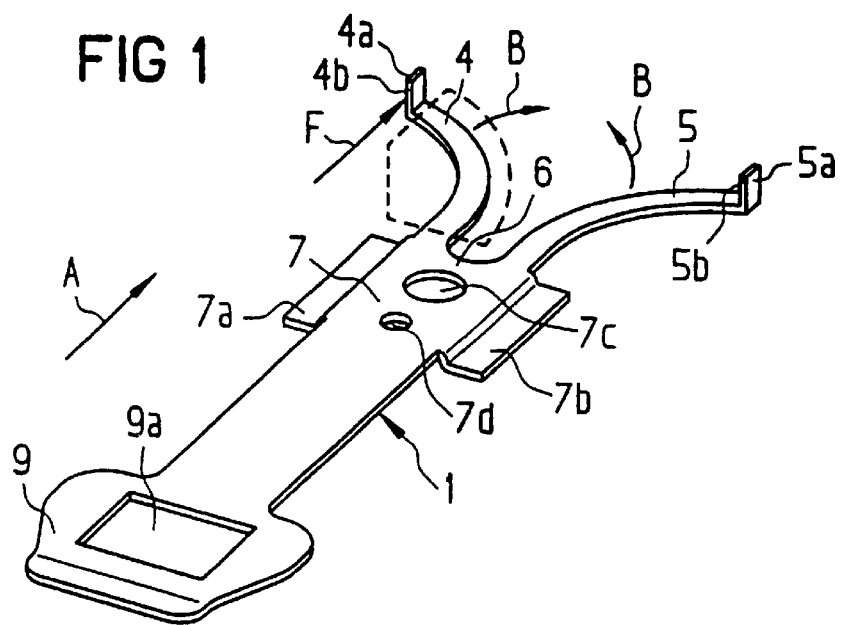
FIG. 1 is a perspective view of a spring.

Referring now to the figures of the drawing in detail and first, particularly, to FIG. 1 thereof, there is seen a part which is referred to as the springing element, or spring 1. The spring 1 is cut from a flat sheet and it is substantially Y-shaped. The two free arms of the Y shape are fashioned as springing legs 4, 5 that project away from each other. Catches having active surfaces 4b, 5b are fashioned at the ends 4a, 5a of the legs. The legs 4, 5 converge at the back end 6 of a tongue 7. The tongue has mounting and grounding lugs 7a, 7b that are impressed in the center region, and it extends in a direction opposite the direction of mounting (which is referenced A and which is discussed in detail below) up to a front end 9. The end 9 is constructed as a springing locking strap or clip formed with an opening 9a. The dotted lines indicate the bending zone of the springing material that is available to the active surface 4b for elastic deformation of the leg 4 given an impact F.

Figure 2:
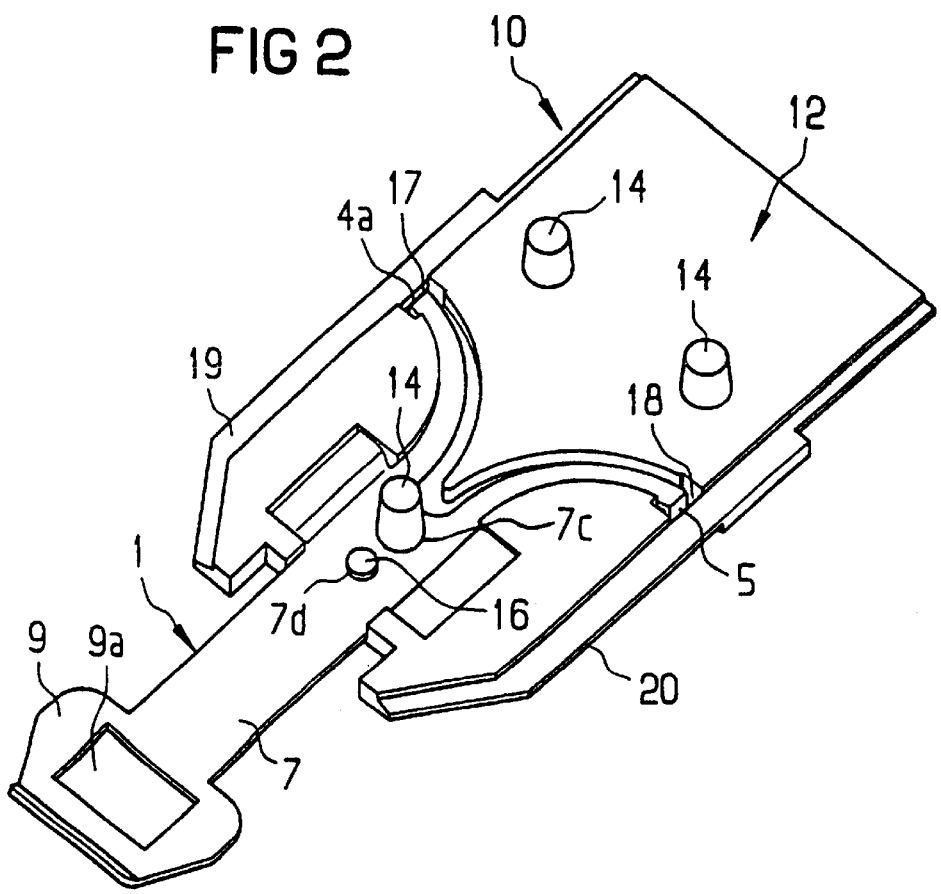
FIG. 2 is a bottom perspective view of a mounting holder according to the invention.

Referring now to FIG. 2, there is shown a bottom side 12 of the novel mounting holder 10. The bottom side 12 has several mounting tabs 14, which serve for positioning the mounting holder on a PCB, for instance. To this end, the tabs 14 penetrate corresponding boreholes in the printed circuit board—which is not illustrated in FIG. 2. A tab 14 and a holding pin 16 penetrate corresponding boreholes 7c, 7d of the tongue 7. In the position represented in FIG. 2, the tongue 7 has been turned about its longitudinal axis relative to the representation in FIG. 1. The spring 1 is inserted in recesses or depressions corresponding to its shape, so that the structural height of the plate type mounting holder is not increased in spite of the integrated spring. Thus, in practice a structural height of less than 1.5 mm can be realized given a spring excursion of 0.4 mm. The catches 4a, 5a penetrate through-openings 17, 18 that are provided in the mounting holder 10. At its narrow sides, the mounting holder 10 comprises longitudinal rails 19, 20, which are grasped from behind, in a manner that is described below, by corresponding angles of a subassembly housing, which successively engage the rails 19, 20 in the mounting process.

FIG. 3 shows a view of the top side 22 of the mounting holder 10 represented in FIG. 2. It is clear that the catches 4a, 5a penetrate the through-openings 17, 18 completely and thus protrude beyond the top side 22. The element 1 that is connected to the mounting holder, together with the catches thereof, which exert a spring force which is generated by the deflected legs upon a subassembly that has been led into the end position, form an ejection mechanism 23. Close behind the catches 4a, 4b, a rear plateau 24 of the mounting holder 10 follows, on which it is possible to dispose electrical contacts that work in conjunction with corresponding contact surfaces of the subassembly being assembled for the purpose of electrical contacting. The contacts or contact strips can also be disposed behind the plateau (see FIG. 5).

FIG. 4 shows a subassembly 30 which has been separated from its internal components in order to provide a better view of mechanical features that are essential to the invention. FIG. 4 shows the housing 32 of the subassembly 30 from the bottom 33.

Besides the stops 34 to 37 that were mentioned in connection with FIG. 2, inwardly bent metal straps 39, 40 that face each other, which are worked from a shielding plate 42, can also be seen. In addition, a locking nose 45 is provided in the front-side region 43 of the housing. The nose cooperates with the recess 9a of the front end 9 of the tongue in the end position (FIGS. 2 and 3).

In the mounting of the subassembly 30 on the mounting holder 10, the stops 34 to 37 first grasp the rails 19, 20 of the mounting holder behind and thus guide the further movement of the subassembly. In this process, the bottom side 33 of the subassembly sweeps over the top side 22 of the mounting holder 10 in the mounting direction A.

Shortly before the end position 50 shown in FIG. 5 is attained, the straps 39, 40 acting as stops also come in contact with the catches 4a, 5a of the ejection mechanism 23, i.e. with the active surfaces 4b, 5b of said catches. In this process, the springing legs 4, 5 execute an arc-shaped movement toward one another, as indicated by the arrows B in FIGS. 1 and 3. This movement generates a path-dependent spring force, which is exerted by the legs 4,5 upon the stops 39, 40, and thus upon the subassembly. When the end position 50 is attained, contacts 52, which are merely suggested in the Fig., rest on corresponding contact surfaces on the bottom side of a printed board (which is not included in the figure) of the subassembly 30.

FIG. 5 also indicates how the locking nose 45 (FIG. 4) engages in the recess 9a of the tongue 7 and thus locks the subassembly 30 in the axial direction. The forces that are exerted by the ejection mechanism 23 are thus received by the tongue 7 in the end-position state. In the guiding of the subassembly 30 into the end position 50, the spring excursion generates an increasing spring power, which the user can perceive easily in the mounting of the subassembly. This signals to him that the attainment of the end position is imminent.

The spring 1 which is integrated in the mounting holder 10 is realized as a flat sheet part (FIG. 1) and thus requires an extremely small structural height, while on the other hand it is possible to generate high spring forces by virtue of the cross-sectional orientation of the flat springing legs 4, 5. These advantageously contribute to overcoming the friction forces that are exerted upon the subassembly by the electrical contacts 52 and that counteract the removal motion. The individual spring forces can be modified by shaping the legs 4, 5 accordingly. In the detachment of the subassembly, first the recess 9a is disengaged from the nose 45, whereupon the subassembly is pushed forward in a direction opposite the direction of mounting A consequent to the impacting of the straps 39, 40 by the legs 4, 5 of the ejection mechanism 23. This way, the subassembly can be grasped comfortably. Another advantageous feature of the ejection mechanism is that subassemblies which have not reached the end position or which have left the end position clearly protrude.

We claim:

1. A mounting holder assembly, comprising:

a mounting holder for detachably fixing a subassembly in an operational end position, the subassembly having a stop at a bottom wide thereof, the mounting holder having a top side configured to receive thereon a subassembly to be moved along a given mounting direction into an end position, and a through opening formed therein; and an ejection mechanism comprising at least one spring disposed to exert a spring force on the subassembly in the end position thereof in a direction opposite the mounting direction, said spring being disposed at a bottom side of the mounting holder and said spring formed with at least one catch penetrating said through opening in said mounting holder and projecting beyond said top side, said catch being adapted to come into contact with the stop at the bottom side of the subassembly when the subassembly is moved into the end position in order to deflect said spring, said spring including a tongue extending beneath the subassembly away from said catch in a direction opposite the mounting direction and being formed with a locking element at a forward free end thereof, and configured to Cooperate with a locking partner of the subassembly in the end position.

2. The mounting holder assembly according to claim 1, wherein said spring is formed with two springing legs bent away from one other, said springing legs having ends, each formed with a respective catch.

3. The mounting holder assembly according to claim 1, which comprises the bottom side opposite said top side and opposite the subassembly, and formed to receive said spring.

4. The mounting holder assembly according to claim 1, wherein said spring is formed from a flat sheet.

5. The mounting holder assembly according to claim 1 wherein said spring is formed of conductive material.

6. In a mounting holder having a hole formed therein and being usable for detachably fixing a subassembly in an operational end position, the subassembly having a stop at a bottom side thereof, the improvement which comprises:

a top side configured to receive thereon a subassembly to be moved along a given mounting direction into an end position; and an ejection mechanism including at least one spring disposed to exert a spring force on the subassembly in the end position thereof in a direction opposite the mounting direction, said spring being disposes at a bottom side of the mounting holder and maid spring formed with at least one catch penetrating said through opening in said mounting holder and projecting beyond said top side, said catch being adapted to come into contact with the stop at the bottom side of the subassembly when the subassembly is moved into the end position in order to deflect said spring, said spring including a tongue extending beneath the subassembly away from said catch in a direction opposite the mounting direction and being formed with a rocking element at a forward free end thereof, and configured to cooperate with a locking partner of the subassembly in the end position.

\* \* \* \* \*